United States Patent
Kim et al.

(10) Patent No.: US 8,951,713 B2
(45) Date of Patent: Feb. 10, 2015

(54) ALKALI-SOLUBLE RESIN AND NEGATIVE-TYPE PHOTOSENSITIVE RESIN COMPOSITION COMPRISING THE SAME

(71) Applicant: LG Chem, Ltd., Seoul (KR)

(72) Inventors: Han Soo Kim, Daejeon (KR); Sung Hyun Kim, Daejeon (KR); Kwang Han Park, Daejeon (KR); Min Young Lim, Seongnam-si (KR); Yoon Hee Heo, Daejeon (KR); Ji Heum Yoo, Daejeon (KR); Sun Hwa Kim, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 13/742,197

(22) Filed: Jan. 15, 2013

(65) Prior Publication Data

US 2013/0130176 A1     May 23, 2013

Related U.S. Application Data

(62) Division of application No. 12/448,757, filed as application No. PCT/KR2008/005843 on Oct. 6, 2008, now abandoned.

(30) Foreign Application Priority Data

Oct. 26, 2007    (KR) ........................ 10-2007-0108043

(51) Int. Cl.
| | | |
|---|---|---|
| *G03F 7/033* | (2006.01) |
| *G03F 7/027* | (2006.01) |
| *G03F 7/00* | (2006.01) |
| *G03F 7/038* | (2006.01) |
| *C08F 2/38* | (2006.01) |
| *C08F 120/18* | (2006.01) |
| *C08F 220/06* | (2006.01) |
| *C08F 220/10* | (2006.01) |
| *C08F 222/00* | (2006.01) |

(52) U.S. Cl.
CPC .............. *G03F 7/027* (2013.01); *G03F 7/0007* (2013.01); *G03F 7/0382* (2013.01); *G03F 7/033* (2013.01); *C08F 2/38* (2013.01); *C08F 120/18* (2013.01); *C08F 220/06* (2013.01); *C08F 220/10* (2013.01); *C08F 222/00* (2013.01)
USPC .......................... 430/281.1; 430/7; 430/288.1

(58) Field of Classification Search
CPC ................................. G03F 7/0382; G03F 7/033
USPC ............................... 430/270.1, 281.1, 288.17
See application file for complete search history.

(56) References Cited

U.S. PATENT DOCUMENTS

| | | | |
|---|---|---|---|
| 3,960,824 A | | 6/1976 | Hicks |
| 4,435,497 A | | 3/1984 | Irving |
| 4,439,291 A | | 3/1984 | Irving |
| 4,463,169 A | | 7/1984 | Irving |
| 5,821,016 A | * | 10/1998 | Satoh et al. ................. 430/7 |
| 2003/0069376 A1 | | 4/2003 | Dean |
| 2004/0157140 A1 | * | 8/2004 | Kamata et al. .............. 430/7 |

FOREIGN PATENT DOCUMENTS

| | | |
|---|---|---|
| EP | 0069069 | 6/1982 |
| JP | 55-000401 | 1/1980 |
| JP | 56-093718 | 7/1981 |
| JP | 58-002308 | 1/1983 |
| JP | 2003-222717 | 8/2003 |
| JP | 2004-126072 | 4/2004 |
| JP | 2004-126073 | 4/2004 |

* cited by examiner

*Primary Examiner* — John Chu
(74) *Attorney, Agent, or Firm* — McKenna Long & Aldridge LLP

(57) ABSTRACT

An alkali-soluble resin is provided. The alkali-soluble resin is prepared using a polyfunctional thiol compound as a chain transfer agent. The alkali-soluble resin has a lower viscosity than a resin having the same molecular weight. Further provided is a negative-type photosensitive resin composition comprising the alkali-soluble resin as a binder resin. The use of the alkali-soluble resin lowers the overall viscosity of the photosensitive resin composition to effectively reduce the height of a stepped portion of a photoresist pattern using a small amount of the photosensitive resin composition.

8 Claims, 1 Drawing Sheet

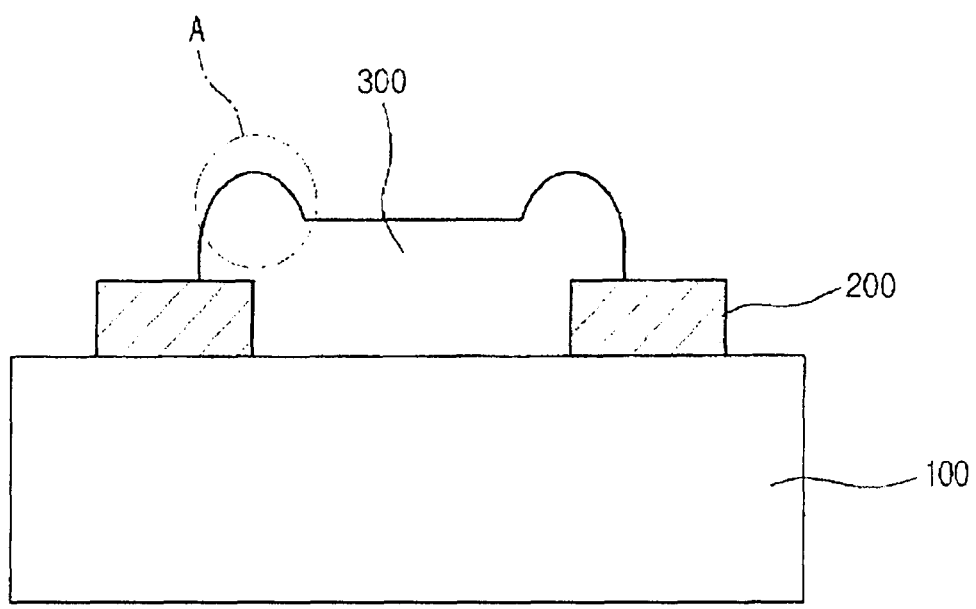

ALKALI-SOLUBLE RESIN AND NEGATIVE-TYPE PHOTOSENSITIVE RESIN COMPOSITION COMPRISING THE SAME

This application is a Divisional of U.S. patent application Ser. No. 12/448,757, filed Jul. 6, 2009, which is the national stage application of PCT/KR2008/005843, filed on Oct. 6, 2008, which claims the benefit of Korean Patent Application No. 10-2007-0108043, filed on Oct. 26, 2007, all of which are hereby incorporated by reference in their entirety.

TECHNICAL FIELD

The present invention relates to an alkali-soluble resin and a negative-type photosensitive resin composition comprising the alkali-soluble resin. More specifically, the present invention relates to a low-viscosity alkali-soluble resin that is prepared by radical polymerization of an acid group-containing monomer and a monomer polymerizable therewith in the presence of a polyfunctional thiol compound as a chain transfer agent, and a negative-type photosensitive resin composition comprising the alkali-soluble resin as a binder resin.

BACKGROUND ART

A negative-type photosensitive resin composition typically comprises an alkali-soluble resin, a polymerizable compound having at least one ethylenically unsaturated bond, a photopolymerization initiator and a solvent. The typical negative-type photosensitive resin composition is generally patterned by applying the resin composition to a substrate to form a film, irradiating a specific portion of the film with light through a photomask, and developing the exposed film to remove the unexposed portion of the film.

Such photosensitive resin compositions are used in various applications, including photosensitizing materials for the production of color filters, overcoat photosensitizing materials, column spacers, light-shielding insulating materials, etc.

With the recent increasing demand for liquid crystal displays (LCDs) in desktop computers and LCD TVs as well as notebook computers, LCDs are required to realize high quality colors. To comply with this requirement, pigment concentrations of photosensitizing materials for color filters are gradually increasing with finer dispersion of pigment particles. However, the developability of the photosensitizing materials tends to be poor. Further, there is a growing tendency to reduce the developing time of photosensitive resin composition for the production of color filters substrate to improve the production yield per unit time. Under these circumstances, an improvement in the developability of photosensitive resin compositions is needed.

A representative approach to improve the developability of photosensitive resin compositions is to increase the acid value (AV) of alkali-soluble resins as constituent binder resins of the photosensitive resin compositions. Another approach is to decrease the molecular weight (Mw) of the alkali-soluble resins.

On the other hand, a typical photosensitive resin composition comprises an alkali-soluble resin as a binder resin that is prepared by radical polymerization of an acid group-containing monomer and an ethylenically unsaturated monomer in the presence of a chain transfer agent (CTA). The chain transfer agent serves to control the molecular weight of the final resin. A mercaptan compound is most widely used as the chain transfer agent.

Recent issues encountered in the production of LCD color filter substrates are the formation of stepped portions of color patterns on black matrixes (BMs) and the use of large amounts of photoresists.

FIG. 1 is a partially enlarged cross-sectional view of a color filter substrate for an LCD. As shown in FIG. 1, the color filter comprises a black matrix 200 formed on a substrate 100 and a color filter layer 300 covering a portion of the black matrix 200. A stepped portion 'A' is formed along the edge of the color filter layer 300 due to the step height of the black matrix 200.

Thereafter, an alignment layer is formed on the color filter substrate and rubbing is performed. At this time, the stepped portion is insufficiently rubbed to cause a deterioration in the image quality (e.g., an increase in black luminance and a reduction in color contrast) of the LCD. In order to reduce the height (i.e. the difference in height between the distal end and the center of the pattern) of the stepped portion while maintaining a predetermined thickness of the pattern, it is necessary to lower the viscosity of a photosensitive resin composition for the formation of the color filter layer.

Thus, the content of a relatively viscous crosslinking agent in the photosensitive resin composition can be lowered to reduce the height of the stepped portion. Alternatively, the height of the stepped portion can be reduced by decreasing the molecular weight of a constituent binder resin to lower the viscosity of the photosensitive resin composition. However, the former method has the disadvantage of poor sensitivity despite a substantial reduction in the viscosity of the composition. According to the latter method, the composition may suffer from the disadvantages of poor chemical resistance and pattern peeling upon development. Further, the height of the stepped portion can be reduced by lowering the acid value of a constituent binder resin, but this is undesirable in terms of developability.

The photoresist must be used in reduced amounts with a high solids content to achieve target color coordinates. In this case, an increase in the viscosity of the composition is inevitably caused to make the coating thick, resulting in color distortion.

Under these circumstances, there is an urgent need to develop a photosensitive resin composition whose viscosity is sufficiently low so as to reduce the height of a stepped portion of a color pattern on a black matrix in a small amount.

DISCLOSURE OF INVENTION

Technical Problem

The present invention has been made in an effort to solve the problems of the prior art, and it is an object of the present invention to provide an alkali-soluble resin whose viscosity is low and whose molecular weight and acid value are maintained at constant levels.

Another object of the present invention is to provide a composition for the preparation of the alkali-soluble resin (hereinafter, referred to simply as an 'alkali-soluble resin composition').

Still another object of the present invention is to provide a negative-type photosensitive resin composition comprising the alkali-soluble resin as a binder resin.

Technical Solution

In accordance with an aspect of the present invention, there is provided an alkali-soluble resin composition which comprises an acid group-containing monomer, a monomer polymerizable with the acid group-containing monomer, and a polyfunctional thiol compound as a chain transfer agent.

In accordance with another aspect of the present invention, there is provided an alkali-soluble resin prepared from the alkali-soluble resin composition.

Specifically, the alkali-soluble resin is prepared by condensation of an acid group-containing monomer and a monomer polymerizable with the acid group-containing monomer in the presence of a polyfunctional thiol compound as a chain transfer agent. The alkali-soluble resin has a branched structure rather than a linear structure. Due to this structure, the alkali-soluble resin has a lower viscosity than a linear alkali-soluble resin having the same molecular weight.

In accordance with yet another aspect of the present invention, there is provided a negative-type photosensitive resin composition comprising the alkali-soluble resin as a binder resin.

The use of the low-viscosity alkali-soluble resin lowers the overall viscosity of the photosensitive resin composition.

Advantageous Effects

The alkali-soluble resin of the present invention is prepared using a polyfunctional thiol compound as a chain transfer agent. The alkali-soluble resin of the present invention has a lower viscosity than a linear alkali-soluble resin having the same molecular weight. The negative-type photosensitive resin composition of the present invention comprises the alkali-soluble resin as a binder resin to effectively reduce the height of a stepped portion of a photoresist pattern in a small amount. Furthermore, the negative-type photosensitive resin composition of the present invention exhibits improved chemical resistance and good developability.

BRIEF DESCRIPTION OF THE DRAWINGS

FIG. 1 is a partially enlarged cross-sectional view of a typical color filter substrate.

BEST MODE FOR CARRYING OUT THE INVENTION

Preferred embodiments of the present invention will now be described in more detail.

The present invention provides an alkali-soluble resin prepared from a resin composition comprising an acid group-containing monomer, a monomer polymerizable with the acid group-containing monomer and a polyfunctional thiol compound as a chain transfer agent. The chain transfer agent serves to control the molecular weight of the final resin to be a low level.

Any aliphatic or aromatic polyfunctional thiol compound may be used without particular limitation as the chain transfer agent, and specific examples thereof include glycol dimercaptoacetate, trimethylolpropane tris(3-mercaptopropionate), trimethylolpropane tris(2-mercaptopropionate), trimethylolpropane tris(2-mercaptoacetate), pentaerythritol tetrakis(thioglycolate), pentaerythritol tetrakis(2-mercaptoacetate), allyl mercaptan, ethylene glycol dimercaptopropionate, trithiocyanuric acid (1,3,5-triazine-2,4,6-trithiol), 3-dithiophenyl ether, 1,3-dimethylthiomethylbenzene, pentaerythritol tetrakismercaptopropionate, 1,4-butanedithiol, 1,5-pentanedithiol, 1,6-pentanedithiol, tetramethylene glycol bismercaptopropionate, 1,6-hexyldiol bismercaptopropionate, pentaerythritol bismercaptopropionate, pentaerythritol trismercaptopropionate, trimethylolpropane bismercaptopropionate, trimethylolpropane trismercaptopropionate, dipentaerythritol trismercaptopropionate, sorbitol trismercaptopropionate, sorbitol tetrakismercaptopropionate, sorbitol hexakismercaptopropionate, dithioethyl terephthalate, 1,6-hexanediol dithioethyl ether, 1,5-pentanediol dithioethyl ether, pentaerythritol tetra(β-thioethyl ether).

These thiol compounds may be used alone or as a mixture of two or more thereof. The content of the polyfunctional thiol compound is 0.1 to 10% by weight and preferably 1 to 8% by weight, based on the total solids content of all monomers. If the polyfunctional thiol compound is present in an amount of more than 10% by weight, the molecular weight distribution of the resin is broad and the unreacted polyfunctional thiol compound may impair the stability of a composition using the resin.

Specifically, the acid group-containing monomer is selected from the group consisting of, but not limited to, (meth)acrylic acid, crotonic acid, itaconic acid, maleic acid, fumaric acid, monomethyl maleic acid, isoprene sulfonic acid, styrene sulfonic acid, 5-norbornene-2-carboxylic acid, mono-2-((meth)acryloyloxy)ethyl phthalate, mono-2-((meth)acryloyloxy)ethyl succinate, ω-carboxy polycaprolactone mono(meth)acrylate, and mixtures thereof.

The monomer polymerizable with the acid group-containing monomer is selected from the group consisting of, but not limited to, unsaturated carboxylic acid ester monomers, aromatic vinyl monomers, unsaturated ether monomers, N-vinyl tertiary amine monomers, unsaturated imide monomers, maleic anhydride monomers, and mixtures thereof.

Specific examples of the unsaturated carboxylic acid ester monomers include, but are not particularly limited to, benzyl (meth)acrylate, methyl(meth)acrylate, ethyl(meth)acrylate, butyl(meth)acrylate, dimethylaminoethyl(meth)acrylate, isobutyl(meth)acrylate, t-butyl(meth)acrylate, cyclohexyl (meth)acrylate, isobornyl(meth)acrylate, ethylhexyl(meth) acrylate, 2-phenoxyethyl(meth)acrylate, tetrahydrofurfuyl (meth)acrylate, hydroxyethyl(meth)acrylate, 2-hydroxypropyl(meth)acrylate, 2-hydroxy-3-chloropropyl (meth)acrylate, 4-hydroxybutyl(meth)acrylate, acyloctyloxy-2-hydroxypropyl(meth)acrylate, glycerol(meth)acrylate, 2-methoxyethyl(meth)acrylate, 3-methoxybutyl(meth) acrylate, ethoxydiethylene glycol(meth)acrylate, methoxytriethylene glycol(meth)acrylate, methoxytripropylene glycol(meth)acrylate, poly(ethylene glycol)methyl ether (meth)acrylate, phenoxydiethylene glycol(meth)acrylate, p-nonylphenoxypolyethylene glycol(meth)acrylate, p-nonylphenoxypolypropylene glycol(meth)acrylate, tetrafluoropropyl(meth)acrylate, 1,1,1,3,3,3-hexafluoroisopropyl (meth)acrylate, octafluoropentyl(meth)acrylate, heptadecafluorodecyl(meth)acrylate, tribromophenyl(meth) acrylate, methyl α-hydroxymethyl acrylate, ethyl α-hydroxymethyl acrylate, propyl α-hydroxymethyl acrylate, butyl α-hydroxymethyl acrylate, dicyclopentanyl(meth) acrylate, dicyclopentenyl(meth)acrylate, dicyclopentanyloxyethyl(meth)acrylate, dicyclopentenyloxyethyl(meth) acrylate, and mixtures thereof.

Specific examples of the aromatic vinyl monomers include, but are not particularly limited to, styrene, α-methylstyrene, o-vinyltoluene, m-vinyltoluene and p-vinyltoluene, o-methoxystyrene, m-methoxystyrene, p-methoxystyrene, o-chlorostyrene, m-chlorostyrene, p-chlorostyrene, and mixtures thereof.

Specific examples of the unsaturated ether monomers include, but are not particularly limited to, vinyl methyl ether, vinyl ethyl ether and a mixture thereof.

Specific examples of the N-vinyl tertiary amine monomers include, but are not particularly limited to, N-vinylpyrrolidone, N-vinylcarbazole, N-vinylmorpholine, and mixtures thereof.

Specific examples of the unsaturated imide monomers include, but are not particularly limited to, N-phenylmaleimide, N-(4-chlorophenyl)maleimide, N-(4-hydroxyphenyl) maleimide, N-cyclohexylmaleimide, and mixtures thereof.

Examples of the maleic anhydride monomers include, but are not limited to, maleic anhydride, methylmaleic anhydride, and a mixture thereof.

The alkali-soluble resin can be prepared by any suitable known polymerization process, such as radical polymerization, cationic polymerization, anionic polymerization or polycondensation. In view of ease of preparation and economic efficiency, radical polymerization is particularly preferred.

The acid group-containing monomer may be polymerized with the monomer polymerizable with the acid group-containing monomer in a weight ratio of 5:95 to 45:55.

The use of the polyfunctional thiol compound as a chain transfer agent allows the final alkali-soluble resin to have a branched polymer structure in which the chain transfer agent is incorporated into the side chains rather than to have a linear structure. Due to this structure, the viscosity of the alkali-soluble resin is 20-30% lower than that of a linear alkali-soluble resin having the same molecular weight. Specifically, the alkali-soluble resin has a viscosity of 5 to 15 cps.

The low-viscosity alkali-soluble resin is used as a binder resin of a negative-type photosensitive resin composition to lower the overall viscosity of the resin composition, which will be explained later. That is, by the use of the low-viscosity alkali-soluble resin, problems associated with the formation of a stepped portion of a color pattern using the resin composition can be solved and the amount of the resin composition used for the formation of the color pattern can be reduced.

The alkali-soluble resin composition of the present invention may further comprise at least one additive selected from solvents, polymerization initiators, thermal polymerization inhibitors, molecular weight modifiers, and other additives commonly used in the art.

The alkali-soluble resin has an acid value 50 to 150 KOH mg/g and a weight average molecular weight of 5,000 to 20,000 g/mol on a polystyrene basis.

The present invention also provides a negative-type photosensitive resin composition comprising the low-viscosity alkali-soluble resin as a binder resin.

In view of processability, the alkali-soluble resin is preferably present in an amount of 1 to 30% by weight, based on the total weight of the composition.

The alkali-soluble resin may be used in combination with at least one resin selected from polyester, acrylic, urethane and other resins.

Specifically, the photosensitive resin composition of the present invention comprises the binder resin, a polymerizable compound having at least one ethylenically unsaturated bond, a pigment, a photopolymerization initiator and a solvent.

The polymerizable compound can preferably be selected from:

compounds prepared by esterifying at least one polyhydric alcohol selected from ethylene glycol di(meth)acrylate, polyethylene glycol di(meth)acrylate having 2 to 14 ethylene groups, trimethylolpropane di(meth)acrylate, trimethylolpropane tri(meth)acrylate, pentaerythritol tri(meth)acrylate, pentaerythritol tetra(meth)acrylate, 2-trisacryloyloxymethylethylphthalic acid, propylene glycol di(meth)acrylate having 2 to 14 propylene groups, dipentaerythritol penta(meth) acrylate and dipentaerythritol hexa(meth)acrylate with an α,β-unsaturated carboxylic acid;

compounds prepared by adding (meth)acrylic acid to at least one glycidyl group-containing compound selected from trimethylolpropane triglycidyl ether acrylic acid adducts and bisphenol A diglycidyl ether acrylic acid adducts;

adducts of at least one compound having a hydroxyl group or an ethylenically unsaturated bond selected from phthalic acid diester of β-hydroxyethyl(meth)acrylate and toluene diisocyanate adducts of β-hydroxyethyl(meth)acrylate, and at least one ester selected from ester compounds of polyvalent carboxylic acids and polyisocyanate;

alkyl(meth)acrylic acid esters, such as methyl(meth)acrylate, ethyl(meth)acrylate, butyl(meth)acrylate and 2-ethylhexyl(meth)acrylate;

9,9'-bis[4-(2-acryloyloxyethoxy)phenyl]fluorene; and mixtures thereof.

Specific examples of photopolymerization initiators suitable for use in the present invention include: triazine compounds, such as 2,4-trichloromethyl-(4'-methoxyphenyl)-6-triazine, 2,4-trichloromethyl-(4'-methoxystyryl)-6-triazine, 2,4-trichloromethyl-(piperonyl)-6-triazine, 2,4-trichloromethyl-(3',4'-dimethoxyphenyl)-6-triazine, and 3-{4-[2,4-bis (trichloromethyl)-s-triazin-6-yl]phenylthio}propanoic acid; biimidazole compounds, such as 2,2'-bis(2-chlorophenyl)-4, 4',5,5'-tetraphenylbiimidazole and 2,2'-bis(2,3-dichlorophenyl)-4,4',5,5'-tetraphenylbiimidazole; acetophenone compounds, such as 2-hydroxy-2-methyl-1-phenylpropan-1-one, 1-(4-isopropylphenyl)-2-hydroxy-2-methylpropan-1-one, 4-(2-hydroxyethoxy)-phenyl (2-hydroxy)propyl ketone, 1-hydroxycyclohexyl phenyl ketone, 2,2-dimethoxy-2-phenyl acetophenone, 2-methyl-(4-methylthiophenyl)-2-morpholino-1-propan-1-one (Irgacure-907), and 2-benzyl-2-dimethylamino-1-(4-morpholinophenyl)-butan-1-one (Irgacure-369); Oacyloxime compounds, such as Irgacure OXE 01 (Ciba Geigy) and CGI-242 (Ciba Geigy); benzophenone compounds, such as 4,4'-bis(dimethylamino)benzophenone and 4,4'-bis(diethylamino)benzophenone; thioxanthone compounds, such as 2,4-diethylthioxanthone, 2-chlorothioxanthone, isopropylthioxanthone and diisopropylthioxanthone; phosphine oxide compounds, such as 2,4,6-trimethylbenzoyldiphenylphosphine oxide, bis(2,6-dimethoxybenzoyl)-2,4,4-trimethylpentylphosphine oxide, and bis(2,6-dichlorobenzoyl)propylphosphine oxide; and coumarin compounds, such as 3,3'-carbonylvinyl-7-(diethylamino)coumarin, 3-(2-benzothiazolyl)-7-(diethylamino) coumarin, 3-benzoyl-7-(diethylamino)coumarin, 3-benzoyl-7-methoxy-coumarin, and 10,10'-carbonylbis[1,1,7,7-tetramethyl-2,3,6,7-tetrahydro-1H,5H,11H—Cl]-benzopyrano[6,7,8-ij]-quinolizin-11-one.

The solvent is not particularly limited and can be appropriately selected according to the intended purpose. Specifically, the solvent may preferably be selected from methyl ethyl ketone, methyl cellosolve, ethyl cellosolve, ethylene glycol dimethyl ether, ethylene glycol diethyl ether, propylene glycol dimethyl ether, propylene glycol diethyl ether, diethylene glycol dimethyl ether, diethylene glycol diethyl ether, diethylene glycol methyl ethyl ether, 2-ethoxy propanol, 2-methoxy propanol, 3-methoxy butanol, cyclohexanone, cyclopentanone, propylene glycol methyl ether acetate, propylene glycol ethyl ether acetate, 3-methoxybutyl acetate, ethyl 3-ethoxypropionate, ethyl cellosolve acetate, methyl cellosolve acetate, butyl acetate, dipropylene glycol monomethyl ether, and mixtures thereof.

The constituent components of the photosensitive resin composition are not specially limited and may be those that are commonly used in the art, and the contents thereof can be readily determined by those skilled in the art.

If needed, the photosensitive resin composition of the present invention may further comprise at least one additive selected from photosensitizers, colorants, curing accelerators, thermal polymerization inhibitors, plasticizers, adhesion promoters, fillers, and surfactants. These additives are not specially limited and may be those that are commonly used in the art, and the contents thereof can be readily determined by those skilled in the art.

The colorants may be pigments, dyes and mixtures thereof.

As black pigments, there may be exemplified carbon black, graphite and metal oxides (e.g., titanium black). Commercially available carbon black products are, for example: SEAST 5HIISAF-HS, SEAST KH, SEAST 3HHAF-HS, SEAST NH, SEAST 3M, SEAST 300HAF-LS, SEAST 116HMMAF-HS, SEAST 116MAF, SEAST F MFEF-HS, SEAST SOFEF, SEAST VGPF, SEAST SVHSRF-HS and SEAST SSRF, all of which are sold by Tokai Carbon Co., Ltd.; DIAGRAM BLACK II, DIAGRAM BLACK N339, DIAGRAM BLACK SH, DIAGRAM BLACK H, DIAGRAM LH, DIAGRAM HA, DIAGRAM SF, DIAGRAM N550M, DIAGRAM M, DIAGRAM E, DIAGRAM G, DIAGRAM R, DIAGRAM N760M, DIAGRAM LR, #2700, #2600, #2400, #2350, #2300, #2200, #1000, #980, #900, MCF88, #52, #50, #47, #45, #45L, #25, #CF9, #95, #3030, #3050, MA7, MA77, MA8, MA11, MA100, MA40, OIL7B, OIL9B, OIL11B, OIL30B and OIL31B, all of which are sold by Mitsubishi Chemical Corp.; PRINTEX-U, PRINTEX-V, PRINTEX-140U, PRINTEX-140V, PRINTEX-95, PRINTEX-85, PRINTEX-75, PRINTEX-55, PRINTEX-45, PRINTEX-300, PRINTEX-35, PRINTEX-25, PRINTEX-200, PRINTEX-40, PRINTEX-30, PRINTEX-3, PRINTEX-A, SPECIAL BLACK-550, SPECIAL BLACK-350, SPECIAL BLACK-250, SPECIAL BLACK-100 and LAMP BLACK-101, all of which are sold by Degussa; RAVEN-1100ULTRA, RAVEN-1080ULTRA, RAVEN-1060ULTRA, RAVEN-1040, RAVEN-1035, RAVEN-1020, RAVEN-1000, RAVEN-890H, RAVEN-890, RAVEN-880ULTRA, RAVEN-860ULTRA, RAVEN-850, RAVEN-820, RAVEN-790ULTRA, RAVEN-780ULTRA, RAVEN-760ULTRA, RAVEN-520, RAVEN-500, RAVEN-460, RAVEN-450, RAVEN-430ULTRA, RAVEN-420, RAVEN-410, RAVEN-2500ULTRA, RAVEN-2000, RAVEN-1500, RAVEN-1255, RAVEN-1250, RAVEN-1200, RAVEN-1190ULTRA and RAVEN-1170, all of which are sold by Colombia Carbon Co.; and mixtures thereof.

Colorants that can produce colors other than black, for example: Carmine 6B (C.I. 12490) Phthalocyanine Green (C.I. 74260) Phthalocyanine Blue (C.I. 74160) Perylene Black (BASF K0084 and K0086) Cyanine Black Lionol Yellow (C.I. 21090) Lionol Yellow GRO (C.I. 21090), Benzidine Yellow 4T-564D Victoria Pure Blue (C.I. 42595), C.I. PIGMENT RED 3, 23, 97, 108, 122, 139, 140, 141, 142, 143, 144, 149, 166, 168, 175, 177, 180, 185, 189, 190, 192, 202, 214, 215, 220, 221, 224, 230, 235, 242, 254, 255, 260, 262, 264 and 272; C.I. PIGMENT GREEN 7 and 36; C.I. PIGMENT BLUE 15:1, 15:3, 15:4, 15:6, 16, 22, 28, 36, 60 and 64; C.I. PIGMENT YELLOW 13, 14, 35, 53, 83, 93, 95, 110, 120, 138, 139, 150, 151, 154, 175, 180, 181, 185, 194 and 213; and C.I. PIGMENT VIOLET 15, 19, 23, 29, 32, and 37. White and fluorescent pigments may also be used.

Any thermal polymerization inhibitor known in the art may be used in the present invention, and examples thereof include, but are not limited to, p-anisole, hydroquinone, pyrocatechol, t-butylcatechol, N-nitrosophenylhydroxyamine ammonium salt, N-nitrosophenylhydroxyamine aluminum salt and phenothiazine. These thermal polymerization inhibitors may be used alone or as a mixture of two or more thereof.

Plasticizers, adhesion promoters, fillers and surfactants used in conventional photosensitive resin compositions may also be used in the present invention.

The presence of the low-viscosity alkali-soluble resin lowers the overall viscosity of the photosensitive resin composition. Specifically, the photosensitive resin composition of the present invention has a viscosity of 3 to 10 cps.

The photosensitive resin composition of the present invention is applied to a suitable substrate by any known process such as spin coating, slit-spin coating, roll coating, die coating or curtain coating. The coated substrate is exposed to light and developed to form a photosensitive layer. There is no particular restriction on the exposure and development processes.

The coated substrate can be irradiated with suitable means selected from electromagnetic waves, visible light, electron beam, X-ray and laser according to the intended purpose.

The light irradiation can be conducted using a known light source selected from high-pressure mercury lamps, xenon lamps, carbon arc lamps, halogen lamps, coldcathode tubes for photocopiers, LEDs and semiconductor lasers according to the intended purpose. There is no particular restriction on the irradiation means and the light source.

Further, the development is carried out to remove an uncured region of the exposed photosensitive layer, leaving a permanent pattern.

A developer for use in the development is not particularly limited and can be appropriately selected according to the intended purpose. Suitable developers are hydroxides, carbonates and bicarbonates of alkali metals and alkaline-earth metals, aqueous ammonia, and aqueous solutions of quaternary ammonium salts. Particularly preferred is an aqueous solution of potassium hydroxide.

The developer may be used in combination with a surfactant, an anti-foaming agent, an organic base (e.g., benzylamine, ethylenediamine, ethanolamine, tetramethylammonium hydroxide, diethylenetriamine, triethylenepentamine, morpholine or triethanolamine), an organic solvent (e.g., an alcohol, a ketone, an ester, an ether, an amide or a lactone) for development promotion, etc. The developer may be a water-based solution of an organic solvent and water or an aqueous alkaline solution. An organic solvent may be used alone as the developer.

For example, the photosensitive resin composition of the present invention is spin-coated on glass and pre-baked at about 100° C. for 2 minutes to form a film. The film is exposed to a high-pressure mercury lamp with an exposure energy of 100 mJ/cm2 through a photomask, developed with an aqueous alkaline solution of KOH, washed with deionized water, and post-baked at 200° C. for about 40 minutes to form a pattern.

The thickness of the photosensitive layer may vary depending on the intended purpose. A preferred thickness of the photosensitive layer is in the range of 1 to 5 μm, but is not limited to this range.

MODE FOR THE INVENTION

Hereinafter, the present invention will be explained in more detail with reference to the following examples. However, these examples are not intended to limit the present invention.

EXAMPLES

Synthesis Example 1

Synthesis of Alkali-Soluble Resin 17.46 g of methacrylic acid as an acid group-containing monomer and 32.54 g of benzyl methacrylate as a monomer capable of reacting with the acid group-containing monomer were allowed to react in the presence of AIBN as a reaction initiator. The reaction mixture was refluxed in propyleneglycol monomethylether acetate as a solvent with stirring and 2.75 g of trimethylolpropane trismercaptopropionate (TMMP) as a chain transfer agent was added thereto. The resulting mixture was allowed to react at 70° C. for 9 hours. 0.02 g of methoxyhydroquinone (MEHQ) as a thermal polymerization inhibitor was added to the reaction mixture. After the reaction temperature was raised to 110° C., 8.71 g of glycidyl methacrylate (GMA) was added in the presence of a catalyst. The mixture was reacted for 10 hours to prepare an alkali-soluble resin.

The alkali-soluble resin was found to have a weight average molecular weight of 10,600 g/mol on a polystyrene basis as measured by GPC, an acid value of 74.78 KOH mg/g, and a viscosity of 7.72 cps as measured using a spindle-type viscometer.

Synthesis Example 2

Synthesis of Alkali-Soluble Resin 17.46 g of methacrylic acid as an acid group-containing monomer and 32.54 g of benzyl methacrylate as a monomer capable of reacting with the acid group-containing monomer were allowed to react in the presence of AIBN as a reaction initiator. The reaction mixture was refluxed propyleneglycol monomethylether acetate as a solvent with stirring and 3.00 g of pentaerythritol tetramercaptopropionate (PEMP) as a chain transfer agent was added thereto. The resulting mixture was allowed to react at 70° C. for 9 hours. 0.02 g of 4-methoxyhydroquinone (MEHQ) as a thermal polymerization inhibitor was added to the reaction mixture. After the reaction temperature was raised to 110° C., 8.71 g of glycidyl methacrylate (GMA) was added in the presence of a catalyst. The mixture was reacted for 10 hours to prepare an alkali-soluble resin.

The alkali-soluble resin was found to have a weight average molecular weight of 10,500 g/mol on a polystyrene basis as measured by GPC, an acid value of 75.00 KOH mg/g, and a viscosity of 7.80 cps as measured using a spindle-type viscometer.

Comparative Synthesis Example 1

An alkali-soluble resin was prepared in the same manner as in Synthesis Example 1 except that 1 g of 3-mercaptopropionic acid was used as a chain transfer agent. The alkali-soluble resin was found to have a weight average molecular weight of 10,300 g/mol on a polystyrene basis as measured by GPC, an acid value of 78 KOH mg/g, and a viscosity of 9.75 cps as measured using a spindle-type viscometer.

Example 1

Preparation of Photosensitive Resin Composition 11 g of the alkali-soluble resin prepared in Synthesis Example 1, 50 g of a red pigment dispersion, 13 g of dipentaerythritol hexaacrylate (DPHA) as a polymerizable compound having ethylenically unsaturated bonds, and 2 g of a photopolymerization initiator (Irgacure-369, CIBA Geigy) were mixed in 24 g of propylene glycol monomethyl ether acetate (PGMEA) to prepare a photosensitive resin composition.

The photosensitive resin composition was found to have a viscosity of 5.8 cps.

Example 2

Preparation of Photosensitive Resin Composition

A photosensitive resin composition was prepared in the same manner as in Example 1 except that the alkali-soluble resin of Synthesis Example 2 was used. The photosensitive resin composition was found to have a viscosity of 5.9 cps.

Comparative Example 1

A photosensitive resin composition was prepared in the same manner as in Example 1 except that the alkali-soluble resin of Comparative Synthesis Example 1 was used. The photosensitive resin composition was found to have a viscosity of 7.2 cps.

Experimental Example 1

Evaluation of Developability and Coating Performance of the Photosensitive Resin Compositions Each of the photosensitive resin compositions prepared in Examples 1 and 2 and Comparative Example 1 was spin-coated on glass (5 cm×5 cm) and pre-baked at about 100° C. for 2 minutes to form a film. The film was exposed to a high-pressure mercury lamp with an exposure energy of 200 mJ/cm2 through a photomask, developed with an aqueous alkaline solution of KOH (pH 11.3-11.7) at regular time intervals, washed with deionized water, and post-baked at 200° C. for about 40 minutes to form a pattern. The surface of the glass and the state of the pattern were observed under an optical microscope.

Specifically, after each of the photosensitive resin compositions was developed using a patterned mask having various critical dimensions (CDs), the thickness of the remaining pattern was measured to evaluate the coating performance (adhesiveness) of the photosensitive resin composition. The results are shown in Table 1. The development was performed for a total of 40 seconds. The time when the pattern began to appear on the glass surface and the time when the unexposed portion was completely removed to leave the exposed portion on the glass surface were defined as 'break 1' and 'break 2', respectively. The results are shown in Table 1.

TABLE 1

|  | Developability | | Coating performance (Size of pattern remaining after development, μm) |
|---|---|---|---|
|  | Break 1 (sec) | Break 2 (sec) |  |
| Example 1 | 10 | 26 | 5 |
| Example 2 | 11 | 26 | 5 |
| Comparative Example 1 | 11 | 27 | 6 |

Experimental Example 2

Evaluation of Stepped Portions of Photoresist Patterns and Photoresist Amounts Used Height of stepped portion: Each of the photosensitive resin compositions was applied to a BM pattern to form a color pattern. An alpha stepper was used to measure the height and width of a stepped portion of the color pattern on the BM pattern in vertical and horizontal directions with respect to the color pattern. From the measured values, the vertical and horizontal degrees of flatness of the photoresist were calculated by the following equation:

Degree of flatness of the photoresist (%)=(1−Height (or width) of the stepped portion/Thickness of the BM)×100

Photoresist amount used: The amount of the photoresist required to coat the entire surface of sixth-generation glass (1,500×1,850) was measured.

TABLE 2

| | Degrees of flatness of photoresist pattern (%) | | Photoresist |
|---|---|---|---|
| | Horizontal | Vertical | amount (cc) |
| Example 1 | 38.9 | 23.3 | 50 |
| Example 2 | 38.5 | 23.1 | 51 |
| Comparative Example 1 | 35.7 | 22.0 | 57 |

The results in Tables 1 and 2 reveal that the photosensitive resin compositions of Examples 1 and 2 showed improved characteristics in terms of horizontal and vertical degrees of flatness and were used in relatively small amounts in comparison with the photoresist composition of Comparative Example 1.

The invention claimed is:

1. A negative-type photosensitive resin composition comprising an alkali-soluble resin, a polymerizable compound having at least one ethylenically unsaturated bond, a colorant, a photopolymerization initiator, and a solvent,
wherein alkali-soluble resin is prepared from an alkali-soluble resin composition,
wherein the alkali-soluble resin composition, comprising an acid group-containing monomer,
a monomer polymerizable with the acid group-containing monomer, and
a polyfunctional thiol compound as a chain transfer agent;
wherein the acid group-containing monomer is reacted with the monomer polymerizable with the acid group-containing monomer in a weight ratio of 5:95 to 45:55;
wherein the alkali-soluble resin has a viscosity of 5 to 15 cps; and
wherein the negative-type photosensitive resin composition has a viscosity of 3 to 10 cps.

2. The negative-type photosensitive resin composition according to claim 1,
wherein the polyfunctional thiol compound is an aliphatic or aromatic one.

3. The negative-type photosensitive resin composition according to claim 2,
wherein the polyfunctional thiol compound is selected from the group consisting of glycol dimercaptoacetate, trimethylolpropane tris(3-mercaptopropionate), trimethylolpropane tris(2-mercaptopropionate), trimethylolpropane tris(2-mercaptoacetate), pentaerythritol tetrakis(thioglycolate), pentaerythritol tetrakis(2-mercaptoacetate), allyl mercaptan, ethylene glycol dimercaptopropionate, trithiocyanuric acid (1,3,5-triazine-2,4,6-trithiol), 3-dithiophenyl ether, 1,3-dimethylthiomethylbenzene, pentaerythritol tetrakismercaptopropionate, 1,4-butanedithiol, 1,5-pentanedithiol, 1,6-pentanedithiol, tetra-methylene glycol bismercaptopropionate, 1,6-hexyldiol bismercaptopropionate, pentaerythritol bismercaptopropionate, pentaerythritol trismercaptopropionate, trimethylolpropane bismercaptopropionate, trimethylolpropane trismercaptopropionate, dipentaerythritol trismercaptopropionate, sorbitol trismercaptopropionate, sorbitol tetrakismercaptopropionate, sorbitol hexakismercaptopropionate, dithioethyl terephthalate, 1,6-hexanediol dithioethyl ether, 1,5-pentanediol dithioethyl ether, pentaerythritol tetra(β-thioethyl ether), and mixtures thereof.

4. The negative-type photosensitive resin composition according to claim 1,
wherein the polyfunctional thiol compound is present in an amount of 0.1 to 10% by weight, based on the total solids content of all monomers.

5. The negative-type photosensitive resin composition according to claim 1,
wherein the acid group-containing monomer is selected from the group consisting of (meth)acrylic acid, crotonic acid, itaconic acid, maleic acid, fumaric acid, monomethyl maleic acid, isoprene sulfonic acid, styrene sulfonic acid, 5-norbornene-2-carboxylic acid, mono-2-((meth)acryloyloxy)ethyl phthalate, mono-2-((meth)acryloyloxy)ethyl succinate, co-carboxy polycaprolactone mono(meth)acrylate, and mixtures thereof.

6. The negative-type photosensitive resin composition according to claim 1,
wherein the monomer polymerizable with the acid group-containing monomer is selected from the group consisting of unsaturated carboxylic acid ester monomers, aromatic vinyl monomers, unsaturated ether monomers, N-vinyl tertiary amine monomers, unsaturated imide monomers, maleic anhydride monomers, and mixtures thereof.

7. The negative-type photosensitive resin composition according to claim 1,
wherein the alkali-soluble resin has an acid value 50 to 150 KOH mg/g and a weight average molecular weight of 5,000 to 20,000 g/mol on a polystyrene basis.

8. The negative-type photosensitive resin composition according to claim 1,
wherein the alkali-soluble resin is present in an amount of 1 to 30% by weight, based on the total weight of the negative-type photosensitive resin composition.

* * * * *